United States Patent [19]

Dray et al.

[11] 4,420,745
[45] Dec. 13, 1983

[54] SECURITY SYSTEM

[75] Inventors: Jacques Dray; Paul P. Canobbio, both of Senlis, France

[73] Assignee: Societe Anonyme Trefilunion, Saint-Dizier, France

[21] Appl. No.: 328,646

[22] Filed: Dec. 8, 1981

Related U.S. Application Data

[63] Continuation-in-part of Ser. No. 96,447, Nov. 21, 1979, abandoned.

[30] Foreign Application Priority Data

Dec. 5, 1978 [FR] France ............................... 78 34188

[51] Int. Cl.$^3$ ............................................. G08B 29/00
[52] U.S. Cl. .................................... 340/510; 340/501;
340/511; 340/563; 324/98; 324/DIG. 1;
330/146; 328/162; 328/208; 323/365
[58] Field of Search ................ 340/510, 511, 501, 506,
340/561, 562, 563; 73/27 R, 362 AR; 324/130,
98, 99 R, DIG. 1; 330/146, 76, 290, 294;
328/162, 208, 209; 323/252, 333, 365, 367

[56] References Cited

U.S. PATENT DOCUMENTS

| 2,031,951 | 2/1936 | Hartley | 340/558 |
| 2,931,957 | 4/1960 | Paar | 340/563 |
| 3,801,972 | 4/1974 | Ho Kim et al. | 340/510 |
| 3,939,770 | 2/1976 | Amundson et al. | 340/563 |
| 4,063,447 | 12/1977 | Mathison | 73/27 R |
| 4,065,762 | 12/1977 | Walter | 340/510 |

Primary Examiner—Donnie L. Crosland
Attorney, Agent, or Firm—Young & Thompson

[57] ABSTRACT

A security system of the bridge circuit type has in one of its arms a conducting element whose impedance is to be monitored and in its other arms reference and/or compensating elements, for detecting an unbalance of the bridge resulting from a sudden change in the impedance of the conducting element. At least one of the reference elements has a variable impedance. The phase shift of the signal obtained at the output of the bridge circuit is detected, due to the drift of the bridge circuit, with respect to the A.C. supply frequency. The detection signal is then used for compensating the drift by acting on the reference element having a variable impedance in order to bring the bridge circuit back to balanced condition.

11 Claims, 4 Drawing Figures

SECURITY SYSTEM

This application is a continuation-in-part of our copending application Ser. No. 96,447 filed Nov. 21, 1979 now abandoned.

GENERAL DISCLOSURE

The present invention relates to security systems of the type used whenever it is necessary to be able to detect, with a view to triggering an alarm, a visual and/or audible indication or a manual or automatic correcting maneuver or intervention, any variation or modification of the condition of a unit, apparatus or device comprising at least one conducting element normally present or intentionally incorporated in this unit, apparatus or device.

It relates more particularly to security systems of the type comprising a bridge circuit of which at least one of the arms contains a conducting element such as a conducting wire or an assembly of conducting wires of which it is desired to monitor the electrical characteristic, while the other arms contain reference elements, this bridge being normally balanced, so that a variation of an electrical characteristic of the conducting element, such as its resistance or impedance, provokes an unbalance of the bridge which is detected to trigger the alarm or the intervention. Such a security system may be used in particular in the case of a security fence or similar system composed of conducting wires and surrounding a site or group of sites such as dwellings, pylons, factories, power stations, military or civil sites, etc. with a view to protecting same, when it is desired to detect any attempt to break in or any unauthorized intervention of this fence or like system.

French Pat. No. 2,413,266 has already proposed, in a system of the type in question comprising a bridge circuit, to provide, in another arm of the bridge, a compensating element such as another conducting wire subjected to the same climatic conditions as the conducting element whose electrical characteristic is monitored, in order to avoid the triggering of false alarms due to a variation in the climatic conditions such as the temperature conditions to which the conducting element in question is subjected. Because the conducting element whose characteristic is monitored and the compensating element are each located in an arm of the bridge, if these elements are composed of identical materials, a natural compensation of temperature is established.

However, this compensation is not perfect as each of the elements may be at a slightly different temperature, due for example, particularly in the case of the incorporation of the system in a fence, to a shadow projected onto a part of an element or to any other reason, such as a draught, etc., with the result that there is a drift of the monitored characteristic of this element with respect to the other, and the desired compensation is not absolute.

One object of the invention is to effect a compensation of the drift due either to a variation in temperature between the element to be monitored and the compensating element, or to any other factor.

U.S. Pat. No. 4,063,447 has already proposed a circuit for compensating the drift of a bridge circuit. However, this case is a very particular application in which the bridge circuit comprises sources of reference and measurement current whose characteristics are modified, for compensating the drift, by detection of a signal at the output of the bridge at a moment at which such a signal should not appear, i.e. in the rest state of the bridge. Now, such an arrangement cannot be used in a security system, as the circuit must be maintained in a state of surveillance, this excluding rest periods with a view to monitoring the balance of the bridge and the correction of the drift.

It is a further object of the invention to effect a compensation of the drift while the circuit is in a state of surveillance, and even simultaneously to an alarm detection, the arrangement being such that no compensation occurs in the case of unbalance provoked for example by an attempted trespass and triggering an alarm, while on the contrary an alarm is not triggered when a drift is detected.

It has been known for a long time, as described for example in U.S. Pat. No. 2,031,951, to use in a bridge circuit incorporated in a security system an impedance variation detection for triggering an alarm. However, such a known system does not comprise any drift compensation and consequently does not solve the above-indicated problem.

The invention is related to a security system of the type comprising a bridge circuit having, in one of its arms, a conducting element of which it is desired to monitor the impedance and, in its other arms, reference and/or compensating elements, means for supplying this bridge with alternating current, means for detecting an unbalance of the bridge resulting from a sudden change in impedane of this conducting element due to an attempted break in, to trigger an alarm or an intervention, and means for compensating the drift of this bridge circuit, characterized in that at least one of the reference elements is a variable impedance element, in that means are provided for detecting the phase shift of the signal obtained at the output of the bridge, due to a variation of impedance by drift, with respect to the A.C. supply frequency, and in that other means are provided for provoking, from the detection of this phase shift, a modification of the impedance of this or these reference elements to compensate the drift of the element to be monitored.

The signals resulting from a drift and appearing at the output of the bridge may correspond to four possibilities, namely:

a decrease in the resistance of the element to be monitored, an increase in the resistance of this element to be monitored, a decrease in the pure impedance coefficient of the element to be monitored, an increase in the pure impedance coefficient of this element to be monitored.

In such a case, means are provided to detect the drift resulting from a decrease or increase in the resistance or a decrease or increase in the pure impedance coefficient of the element to be monitored and to identify the type of drift, as well as means for varying the condition of the reference element or elements in a sense compensating or nullifying the corresponding drift signal.

According to another feature of the invention, the means provided at the output of the bridge and detecting the drift are connected to delay circuits or to any other means locating the drift signal in time, acting to apply to the drift signal different delays corresponding to the four above-mentioned possibilities, and there are provided a generator of synchronization frequency derived from the supply frequency of the bridge, coincidence detector circuits for detecting the coincidence between this synchronization frequency and one of the degrees of delay furnished by the delay circuits, relays energized from these coincidence circuits when a coincidence is detected, and means acting selectively in the required sense on the reference elements to vary their characteristic and re-establish the balance of the bridge.

According to a further feature, means are provided to ensure the selection of the signals appearing at the output of the bridge in the case of drift, to separate them from the supply frequency of the bridge.

According to another embodiment, the output of the generator of synchronization frequency derived from the supply frequency of the bridge is connected to the delay circuits, which apply staged delays to this frequency, and the drift signals obtained at the output of the bridge are, after shaping, applied to the coincidence circuits, themselves connected to the delay circuits, in order thus to detect the coincidence between the shaped drift signal obtained from the bridge circuit and one of the delay times of the synchronization frequency, the coincidence signal then obtained being applied to a relay or the like to actuate the means acting selectively in the required sense on the reference elements to vary their characteristic and reestablish the balance of the bridge.

According to another feature, a timing device is provided in the circuit controlling or adjusting the reference elements, which timing device delays the correction of the drift to the desired degree. Thus, as in the case of trespass or the like the response of the bridge in the form of an alarm signal is immediate, this signal may trigger the alarm due to the response time of the servo-control system of the reference elements.

When the alarm circuit is cut off to interrupt the alarm, the signal detected at the output of the bridge is then transmitted to the servo-control system, this automatically restoring the balance of the bridge.

In the case of an arrangement of the type forming the subject matter of the invention, metal masses may be provided in two arms of the bridge, as well as means for detecting the unbalance of the bridge supplied with alternating current resulting from the inductive coupling variation due to these metal masses being brought closer to or moved away from one another. These masses may themselves be composed for example of wires, gratings, sheets, plates or the like, made of any metallic material. They may be separated by any desired means, particularly by water, another liquid, a plastic foam, a spring or the like.

This arrangement makes it possible to produce the security system particularly in the form of a detection mat which may be placed on the ground or buried, and hidden from sight in any desired manner, or which may be placed on a wall, a ceiling, indoors or out of doors, or in or on any ground.

With this arrangement, it is also possible to detect any variation of the coupling between the two metal masses resulting from the presence of a metallic body near one of the plates or therebetween.

BRIEF DESCRIPTION OF THE FIGURES

The invention will be more readily understood on reading the following description with reference to the accompanying drawings, in which.

DETAILED DESCRIPTION

Figure 1:
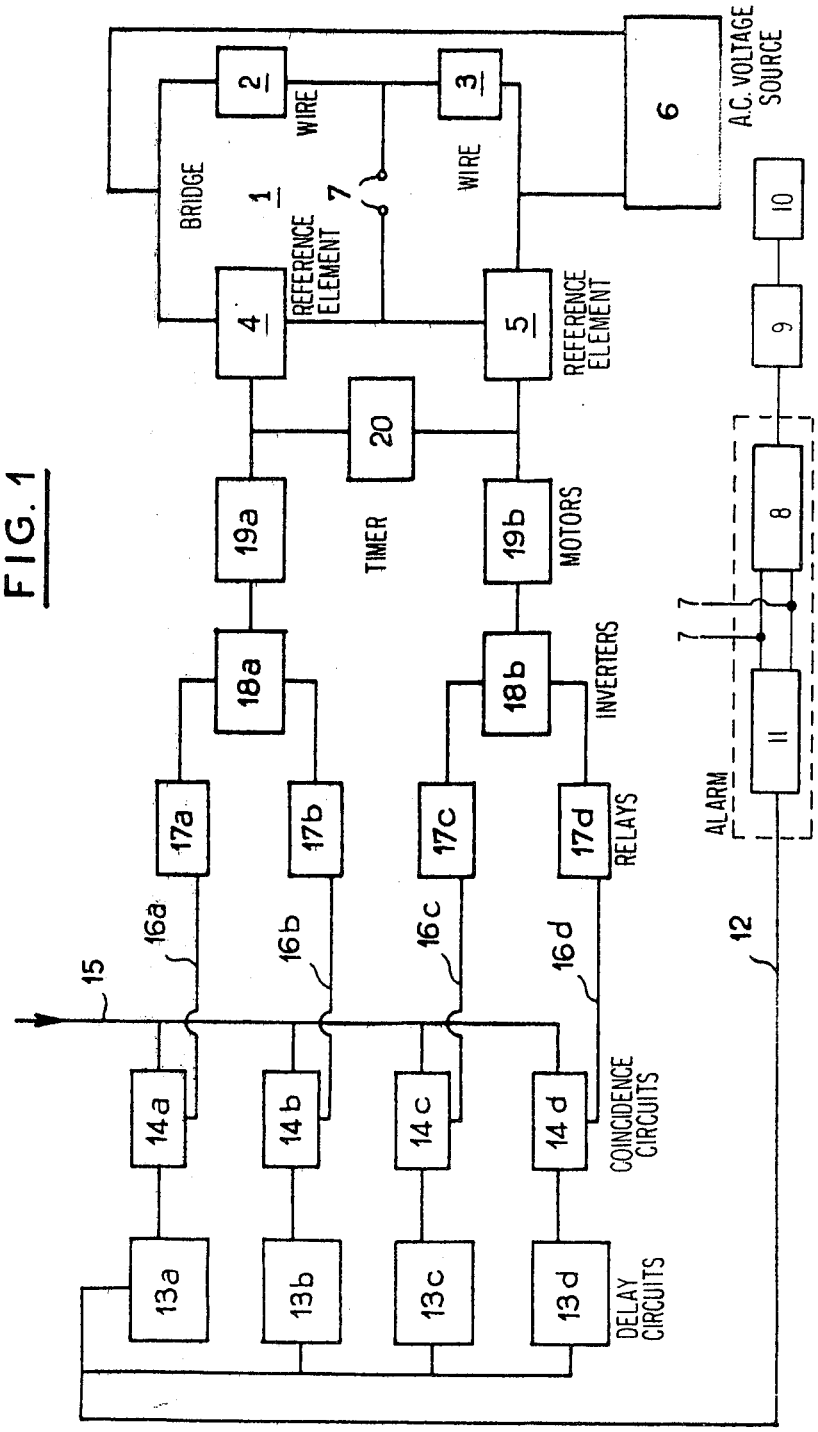
FIG. 1 is a schematic representation of a security system with servo-control for drift compensation.

Referring now to the drawings, FIG. 1 shows a bridge of general known type, generally designated by reference 1, comprising an element 2 such as a conducting wire whose characteristic, for example impedance, variation must be monitored, and another element 3 similar to the preceding one and placed under the same climatic conditions. The other arms of the bridge contain two reference elements 4, 5 which, in the present case, are adjustable by varying their resistance and their pure impedance. This bridge is supplied from a source of A.C. voltage 6 and, in the case of unbalance, a signal appears on its terminals 7.

To simplify the illustration, FIG. 1 shows separately the terminals 7, which are connected to a circuit 8 connected to a self-exciting circuit 9 and to an alarm circuit 10 in known manner, so as to trigger an alarm or provoke an intervention in case of unbalance of the bridge, for example when there is a break-in.

Figure 2:
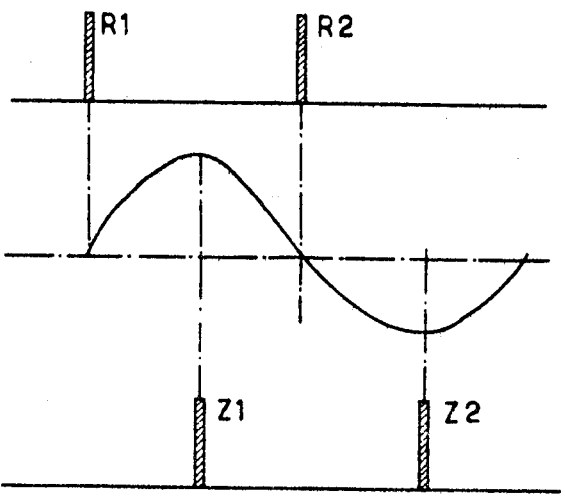
FIG. 2 is an explanatory diagram.

The signal which appears on the terminals 7 in the case of drift is a wave shape which shows the phase shift furnished by the resistance and the pure impedance coefficient. This shift appears with respect to the sine curve which represents the supply signal of the bridge furnished from the source 6. The shift is detected in the circuit 11 at the output of the amplification/processing assembly, before the adjustment of the alarm triggering threshold, this therefore furnishing, by selection, shaped drift signals. These drift signals differ in their phase shift according to the nature of the drift, as indicated previously. This shift is clearly shown in the diagram of FIG. 2, in which R1 and R2 correspond to drift signals resulting from a variation in resistance and Z1 and Z2 to drift signals resulting from a pure impedance or inductance variation. The sine curve represents the supply of the bridge from the source 6. Due to this diversity of nature of the drift, it is then necessary to separate and identify the drift signals for correction or servo-control.

According to the embodiment described, the train of drift signals selected by the circuit 11 is applied by a conductor 12 to four delay circuits 13a, 13b, 13c and 13d. These delay circuits may be constituted by conventional delay lines or by other equivalent systems. They are adjusted to provide different delays, varying by a quarter period of the supply frequency, as a function of the four possibilities mentioned above, namely the decrease or increase in the resistance and the decrease or increase in the pure impedance coefficient. The output of the delay circuits is applied (in the form of square pulses to be able to operate with logic circuits) to coincidence circuits 14a–14d, which moreover receive by a conductor 15 the synchronization frequency derived from the supply frequency of the bridge, after shaping.

When a coincidence is detected between the synchronization frequency and a signal coming from a delay circuit 13a–13d, a servo-control signal is transmitted by one of the conductors 16a–16d to one of the four relays 17a–17d.

These relays are connected in pairs each time to an inverter 18a–18b. Thus, the relays 17a, 17b are connected to the inverter 18a and the relays 17c, 17d are connected to the inverter 18b. Each inverter is itself connected to a motor 19a, 19b, these motors being respectively connected to the variable or adjustable reference elements 4, 5.

It will be understood that, for each pair of relays 17a, 17b, on the one hand, and 17c, 17d on the other hand, the motor 19a, 19b will rotate in one direction or the other according to the coincidence circuits 14a–14d transmitting a signal, so as to compensate the drift detected on the terminals 7 of the bridge 1.

A timing element with threshold adjustment 20 is mounted between the two drift correction channels, in order to trigger servo-control with a desired delay to allow the circuit to react in the required manner to unbalances caused for example by a break-in, i.e. to unbalances having to give rise to an alarm.

In such a case, upon cut off of the alarm circuit and the restoring of the normal condition of the conducting element or elements, of which the condition was modified by the trespass or the like, the servo-control system intervenes to restore the balance of the bridge by a correction ensured on the reference element or elements required. Thus, no new manual adjustment is necessary and the surveillance condition of the system is restored.

Figure 3:
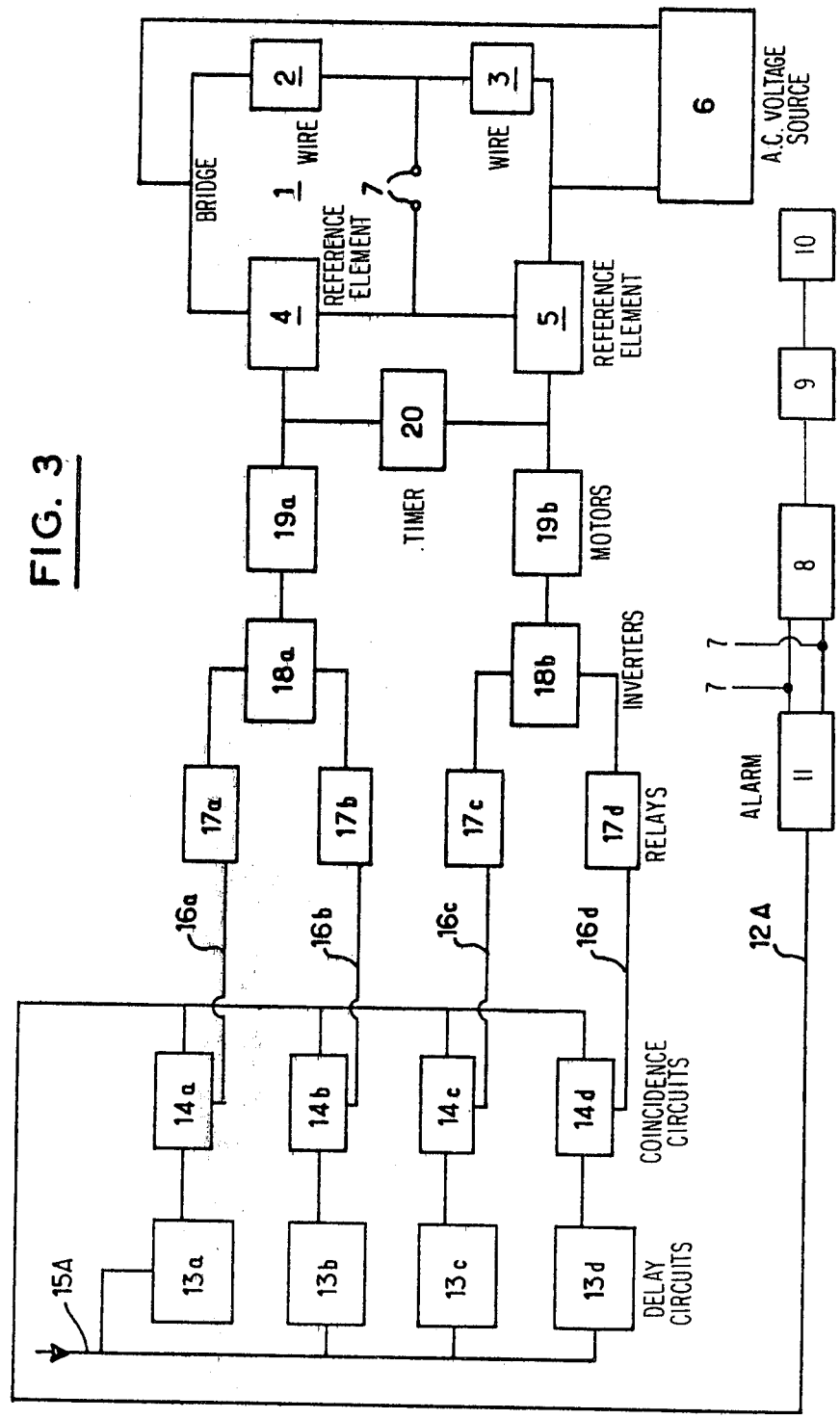
FIG. 3 shows another embodiment.

The embodiment shown in FIG. 3 differs from the arrangement of FIG. 1 in that the delay circuits act on the synchronization frequency derived from the supply frequency of the bridge provided by the source 6, this synchronization frequency being applied to the delay circuits 13a to 13d by the conductor 15A. Furthermore, the shaped drift signals are applied directly to the coincidence circuits 14a to 14d by the conductor 12A, as shown.

The synchronization frequency undergoes, in the delay circuits, delays staged by a quarter period, and according to the nature of the drift, which may have its origin as indicated previously in four different characteristic variations, a coincidence is established and is detected in one of the coincidence circuits 14a to 14d. This coincidence detection here provides an output signal which acts as previously to compensate the drift and to restore the balance of the bridge.

As regards the several circuits, use is made of suitable integrated circuits which are known in that field. As an example the following circuits are used in the embodiment of FIG. 3:

Circuits 14a, 14b, 14c and 14d: CI 7408.
Circuits 17a, 17b, 17c and 17d: BC 337 - 7407.
Circuits 18a and 18b: GE 907 H 11 B 1 - BD 677 - 678.

Figure 4:
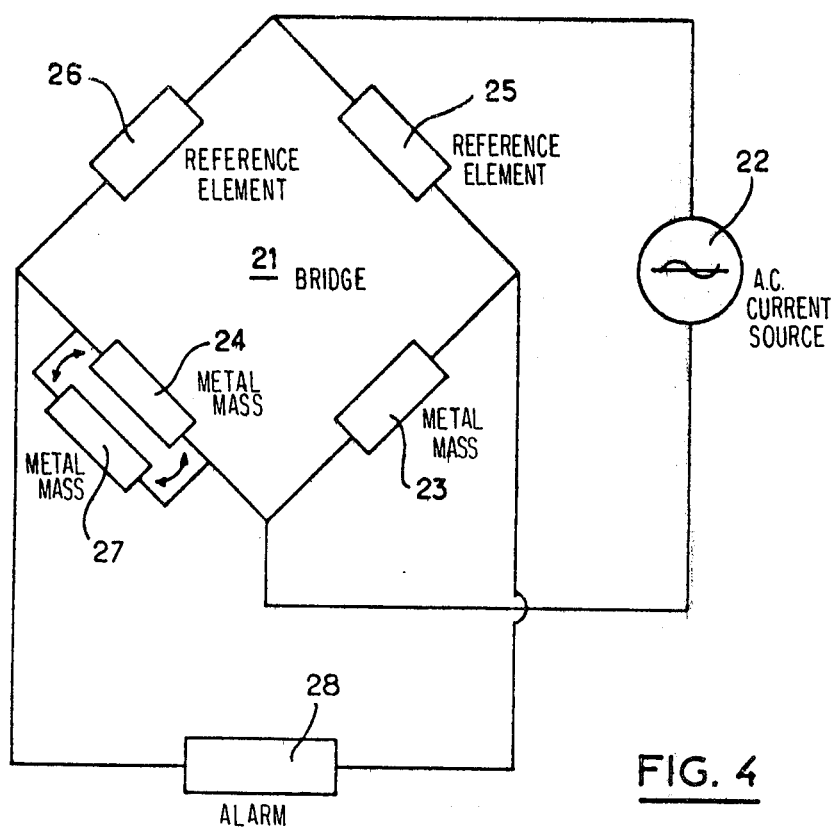
FIG. 4 is a schematic representation of a system comprising metal masses of which the variation in the spacedapart relationship is detected.

FIG. 4 shows a bridge circuit generally designated by reference numeral 21 and supplied from a source of alternating current 22. A first metal mass 23 is mounted in one arm of the bridge, whilst a second metal mass 24 is mounted in a second arm, the other two arms comprising reference elements 25, 26.

In the case of this embodiment, a further metal mass, indicated at 27, is mounted in parallel with the mass 24 in the relevant arm of the bridge. Reference numeral 28 schematically indicates the processing and alarm system which is connected to the output of the bridge. A study of FIG. 4 will clearly show that, if the distance between the matel masses 24 and 27 is modified, there is a variation in the inductive coupling between the two metal masses, this resulting in an unbalance of the bridge which is detected at the output thereof, in order to provide an alarm or trigger an intervention.

As indicated previously, these metal masses may be composed of wires, gratings, sheets, plates or the like, which may be placed in any desired medium and in particular buried in the ground. One possible application corresponds for example to the production of a ground mat comprising the two metal masses, of which the bringing together under the effect of a load exerted on the mat will provoke the variation in inductive coupling creating an unbalance of the bridge and consequently an alarm or intervention.

However, it will be understood that the second metal mass indicated at 27 in FIG. 4, does not necessarily comprise a mass permanently joined to the metal mass 24 and that it could be an outside metal volume constituted for example by a vehicle, machine, a person carrying metal objects, etc. The proximity of this metal volume to the mass 24 would then result in a variation in inductive coupling provoking the unbalance of the bridge and thus supplying at the output thereof a signal triggering an alarm or an intervention.

What is claimed is:

1. A security system for indicating an intrustion into an area being protected, comprising
   (a) a bridge circuit (1) including four branches and having pairs of input and output (7) terminals, said bridge circuit being subject to drift due to a shift in phase of an output signal produced at said output terminals relative to an input signal at said input terminals;
   (b) an alternating current voltage source (6) connected with said bridge circuit input terminals;
   (c) first and second conduting elements (2, 3) connected in two adjacent bridge branches, respectively;
   (d) a pair of reference elements (4, 5) connected in the remaining two bridge branches, respectively, at least one of said reference elements having a variable impedance;
   (e) intrusion indicating means, including
      (1) means (8) connected with said output terminals for monitoring the impedance of one of said conducting elements;
      (2) means (9) connected with said monitoring means to produce an alarm signal in response to a change in the impedance of said one conducting element resulting from an intrusion; and
      (3) alarm circuit means (10) connected with said alarm signal producing means for activating an alarm in response to said alarm signal; and
   (f) means for compensating for said bridge circuit drift, comprising
      (1) phase shift detetor means (11) connected with said output terminals for producing a drift signal corresponding to the output signal phase shift; and
      (2) means connected with said phase shift detector means for modifying the impedance of said one reference element in response to said drift signal.

2. A security system according to claim 1, comprising delay circuits or the like for providing several degrees of delay, said means provided at the output of said bridge circuit for detecting said phase shift signal being connected to said delay circuits, means provided in said delay circuits for applying to said phase shift signal different delays corresponding to the decrease or to the increase of the resistance or to the decrease or the increase of the pure impedance coefficient of said element to be monitored, a generator of synchronization frequency, coincidence detector circuits, said synchronization frequency generator being connected to said coincidence detector circuits for detecting the coincidence between said synchronization frequency and one of the degrees of delay provided by said delay circuits, relays connected to said coincidence detector circuits and energized from said circuits when a coincidence is detected, and means actuated by said relays for acting selectively in the required plus or minus sense on said at least one reference element to vary its characteristic in a plur or minus sense restoring the balance of said bridge circuit.

3. A security system according to claim 2, wherein means are provided for generating said synchronization frequency from the supply frequency for said bridge circuit.

4. A security system as defined in claim 1, wherein said impedance modifying means includes
 (a) means (15A) for providing a synchronization frequency signal from said alternating current voltage source;
 (b) a plurality of delay circuit means (13a, 13b, 13c, 13d) connected with said synchronization frequency signal means for delaying portions of said frequency signal, said delayed portions varying by a quarter period;
 (c) a plurality of coincidence detector circuits (14a, 14b, 14c, 14d) having first inputs connected with said delay circuits, respectively, for receiving said delayed portions of said frequency signal, and second inputs connected with said phase shift detector for receiving said drift signal, whereby coincidence is detected in one of said coincidence detector circuits between said drift signal and said delayed portion of said synchronization frequency signal;
 (d) a plurality of relay circuits (17a, 17b, 17c, 17d) connected with said coincidence detector circuits to produce an output in response to a detected coincidence; and
 (e) means connected with said relay circuits for varying the impedance of said one reference element in response to said relay circuit outputs.

5. A security system according to claim 2, comprising means provided at the output of said bridge circuit for selecting the signals received at said output in the case of a drift and for separating them from the supply frequency of said bridge circuit.

6. A security system according to claim 4, comprising means provided at the output of said bridge circuit for selecting the signals received at said output in the case of a drift and for separating them from the supply frequency of said bridge circuit.

7. A security system according to claim 2, comprising a timing device provided in said means for acting on said at least one reference element, for delaying the correction of the drift.

8. A security system as defined in claim 4, and further comprising timing circuit means (20) connected with said impedance varying means for delaying compensation of said bridge circuit drift.

9. A security system as defined in claim 1, wherein said bridge circuit is in a normally balanced condition, and further wherein said conducting elements comprise first and second metal masses, respectively, said metal masses being inductively coupled, whereby displacement of said metal masses relative to one another unbalances said bridge circuit, thereby changing the impedance on one of said metal masses.

10. A security system as defined in claim 9, and further comprising a third metal mass arranged in one of said bridge branches parallel to one of said first and second metal masses, whereby displacement of said third metal mass relative to said one of said first and second metal masses unbalances said bridge circuit.

11. A security system as defined in claim 9, and further comprising means for detecting the unbalance of said bridge circuit resulting from a variation in inductive coupling when a metal object approaches one of said metal masses.

* * * * *